United States Patent
Takagi et al.

(10) Patent No.: US 8,638,593 B2
(45) Date of Patent: Jan. 28, 2014

(54) SEMICONDUCTOR DEVICE

(75) Inventors: Takumi Takagi, Odawara (JP); Daisuke Sasaki, Fujisawa (JP); Masahiko Nishiyama, Fujisawa (JP); Masatoshi Hasegawa, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 48 days.

(21) Appl. No.: 13/349,447

(22) Filed: Jan. 12, 2012

(65) Prior Publication Data

US 2012/0218812 A1 Aug. 30, 2012

(30) Foreign Application Priority Data

Feb. 24, 2011 (JP) ................................. 2011-037776

(51) Int. Cl.
*G11C 11/00* (2006.01)
(52) U.S. Cl.
USPC .......................................... 365/154; 365/148
(58) Field of Classification Search
USPC ................................................. 365/148, 154
See application file for complete search history.

(56) References Cited

U.S. PATENT DOCUMENTS

| 2006/0259739 | A1* | 11/2006 | Asal et al. ...................... 712/209 |
| 2007/0211545 | A1 | 9/2007 | Otsuka et al. |
| 2008/0055967 | A1* | 3/2008 | Houston et al. ................ 365/154 |
| 2008/0267293 | A1* | 10/2008 | Swami et al. ............. 375/240.16 |
| 2011/0063895 | A1* | 3/2011 | Komatsu et al. ............... 365/156 |

FOREIGN PATENT DOCUMENTS

JP 2007-250586 A 9/2007

* cited by examiner

*Primary Examiner* — Michael Tran
(74) *Attorney, Agent, or Firm* — Miles & Stockbridge P.C.

(57) ABSTRACT

A semiconductor device having an SRAM macro which has a power-off function and facilitates a design associated with a change in storage capacity is provided. The semiconductor device has plural layout units each including a memory array having plural memory cells in an SRAM, a first peripheral circuit that writes data into the memory array and reads the data from the memory array, and a switch group that disconnects the memory array and the first peripheral circuit, and power wires.

6 Claims, 13 Drawing Sheets

SEMICONDUCTOR DEVICE

CLAIM OF PRIORITY

The present application claims priority from Japanese patent application JP 2011-037776 filed on Feb. 24, 2011, the content of which is hereby incorporated by reference into this application.

FIELD OF THE INVENTION

The present invention relates to a semiconductor device, and more particularly to a semiconductor device that controls power supply within the semiconductor device.

BACKGROUND OF THE INVENTION

As a countermeasure against an increase in an off leak current associated with scaling of a static random access memory (SRAM) in a semiconductor storage device having the SRAM, there has been proposed a technique in which a switch is disposed for disconnecting a power supply and a memory cell, and the power supply and the memory cell are disconnected in a standby state where the SRAM does not operate to reduce the off leak current so as to decrease the power consumption of the semiconductor storage device (Japanese Unexamined Patent Application Publication No. 2007-250586).

SUMMARY OF THE INVENTION

The present inventors have studied a layout 200 of an SRAM micro illustrated in FIG. 2 for the purpose of increasing a storage, capacity of a memory macro in laying out a design of the semiconductor device including the SRAM.

The layout 200 includes repeating units 203 which are functional blocks each having a memory array 201 in which multiple memory cells in the SRAM are arranged, a memory array associate circuitry 202, a peripheral circuitry 204, power switch groups 205 and 206 that are concentrated at upper and lower positions of the layout.

When the memory array in which the memory cells in the SRAM are arranged is large-scaled, a load capacity of bit lines that read signals from the memory cells increases to deteriorate the performance of the memory macro. Therefore, in the layout 200, the memory array 201 is divided and arranged vertically so as to keep a given load or lower of the bit lines, thereby suppressing the performance deterioration caused by increasing the load capacity of the bit lines. Also, each of the repeating units 203 is equipped with the memory array associate circuitry 202 necessary for the operation of writing data into the memory array 201 included in each of the repeating units 203, and reading data from the memory array 201. Circuits that can be shared by the repeating units 203 are collected in the peripheral circuitry 204.

Further, in the layout 200 of the SRAM macro, for the purpose of reducing the power consumption, the power switch groups 205 and 206 are arranged at the upper and lower positions of the layout 200 so as to turn off power between the memory array 201, the memory array associate circuitry 202, and the peripheral circuitry 204, and power wires. In the design of a normal layout, after power necessary for the macro has been estimated, a switch group for obtaining a drive force sufficient to supply power required for the macro is arranged. Accordingly, after a required number of repeating units 203 and the peripheral circuitry 204 have been arranged, the switch group for driving the arranged repeating units 203 and the peripheral circuitry 204 are arranged. Hence, the power switch groups 205 and 206 are concentrated at the upper and lower positions of the layout 200 as shown in the layout 200.

However, in the layout 200 of the SRAM macro, when design is conducted while changing the number of repeating units 203, the power required for the SRAM macro, and voltage drops corresponding to the lengths of wires extending from the power switch groups 205 and 206 to the respective repeating units 203 must be taken into account. The drive forces of the power switch groups 205 and 206, and the design of the wires connected to the power switch groups 205 and 206 are reviewed every time the number of repeating units 203 is changed. As a result, the present inventors have found out that the efficiency of design is remarkably deteriorated.

An object of the present invention is to provide a semiconductor device having an SRAM macro which has a power-off function and facilitates the design associated with a change in storage capacity.

In order to address the above problem, according to one aspect of the present invention, there is provided a semiconductor device having multiple layout units, each of the layout units including: a memory array having multiple memory cells in an SRAM; a first peripheral circuit that writes data into the memory array and reads the data from the memory array; and a switch group that disconnects the memory array And the first peripheral circuit, and power wires.

Also, according to another aspect of the present invention, there is provided a semiconductor device having multiple layout units, each of the layout units including: a memory array having multiple memory cells in an SRAM; a first peripheral circuit that writes data into the memory array and reads the data from the memory array; a first switch group that disconnects the memory array and power wires; and a second switch group that disconnects the first peripheral circuit and the power wires.

In,the semiconductor device according to the present invention, the storage capacity can be easily changed by changing the number of repeating units to design the semiconductor device.

DETAILED DESCRIPTION OF THE PREFERRED EMBODIMENTS

First Embodiment

In this embodiment, an SRAM macro having a static memory cell will be described as an example.

Figure 5:
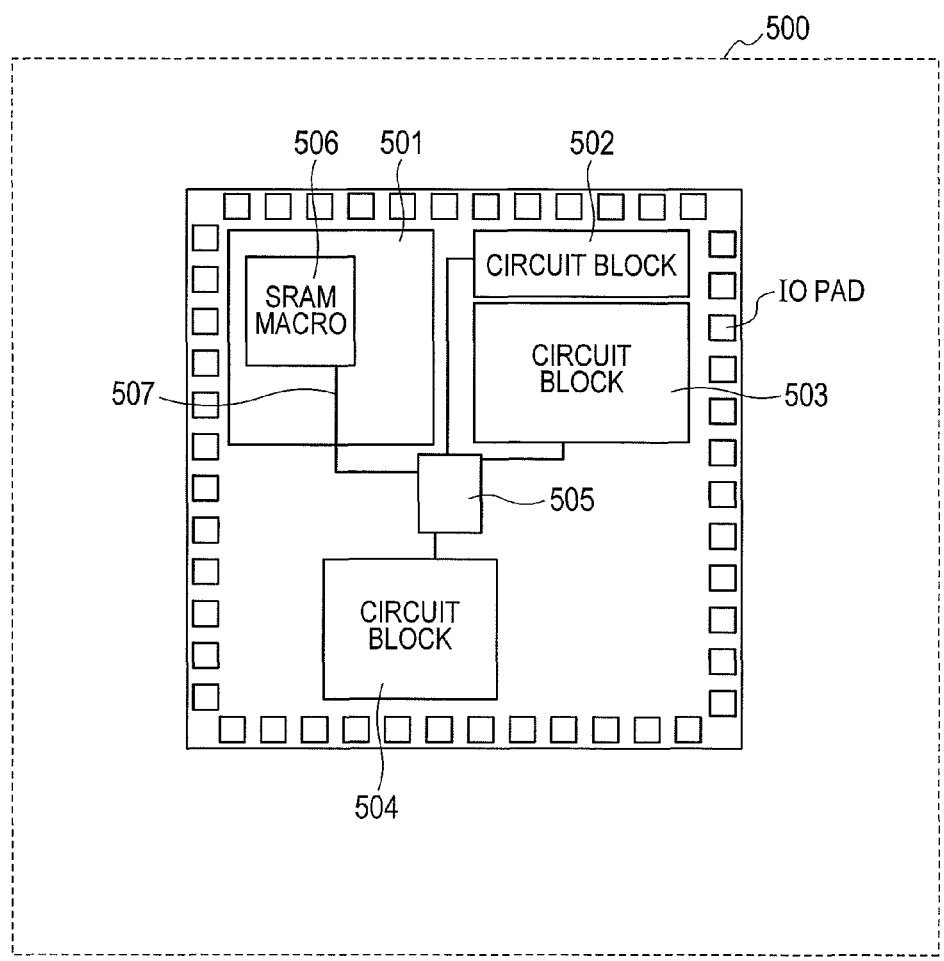
FIG. 5 is a diagram illustrating a semiconductor device according to the embodiment of the present invention.

FIG. 5 is a diagram illustrating a layout placement of a semiconductor device 500 according to this embodiment. The semiconductor device 500 includes multiple circuit blocks 501 to 504, and a power-off control block 505. The circuit block 501 includes an SRAM macro 506 that is a memory macro. The power-off control block 505 and the SRAM macro 506 are connected by a power-off signal line 507 in order to transmit a power-off signal SWD for controlling power-off. Also, in order to transmit the power-off signal SWD to the respective SRAM macros 506 of the other circuit blocks 502 to 504 as well as the micros that conduct the same power-off, as illustrated in FIG. 5, the power-off control block 505 and the circuit blocks 502 to 504 are connected by the power-off signal lines.

The power-off signal SWD is generated by the power-off control block 505, and the SRAM macro 506 is powered off according to the power-off signal SWD. As an example, when a PMOS transistor is used as a power switch for powering off the SRAM macro 506, the power-off control block 505 sets the power-off signal SWD to a signal of a low level that is a VSS potential in normal operation so as to supply power to the SRAM macro 506 from the power wire. In order to move to a power-off state for saving the power of the semiconductor device 500, the power-off control block 505 sets the power-off signal SWD to a signal of a high level that is a VDDC potential to disconnect the SRAM macro 506 and the power wire.

Figure 1:
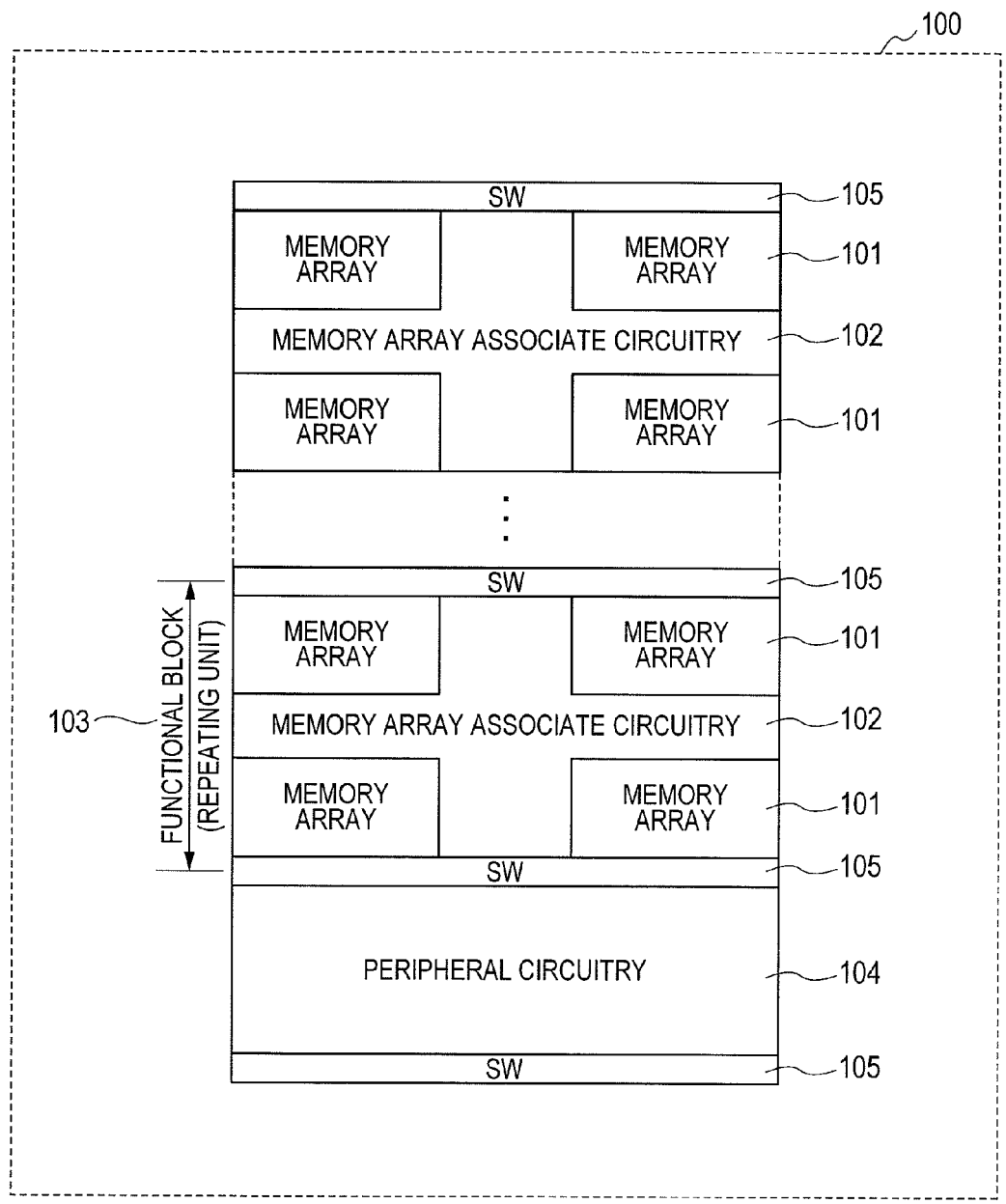
FIG. 1 is a schematic diagram illustrating a layout example of an SRAM macro according to the present invention.

FIG. 1 illustrates a schematic diagram of a layout 100 of the SRAM macro as an example of the layout of the SRAM macro 506. The layout 100 includes multiple repeating units 103 which are functional blocks each having a memory array 101, a memory array associate circuitry 102, and power switch groups 105, and a peripheral circuitry 104. The power switch groups 105 are disposed at upper and lower positions of each of the repeating units 103. In the description of this embodiment, as illustrated in FIG. 1, the repeating units 103 are areas that separate the positions of the repeating placements of the power switch groups 105 in a longitudinal direction of FIG. 1 as boundaries. Also, the power switch groups 105 are also disposed at upper and lower sides of the peripheral circuitry 104. The reason why the power switch groups 105 are similarly arranged around the peripheral circuitry 104 is that the power required by the peripheral circuitry 104 is substantially equal to or lower than the power required by the repeating units 103, and therefore there is no need to newly design the power switch group for the peripheral circuitry 104.

When the memory array in which multiple memory cells in the SRAM are arranged is large-scaled, a load capacity of the bit line for reading a signal from each memory cell increases to deteriorate the performance of the memory macro. Therefore, in the layout 100, the memory array is divided and arranged vertically so as to keep a given load or lower of the bit lines, thereby suppressing the performance deterioration caused by increasing the load capacity of the bit lines. Also, each of the repeating units 103 is equipped with the memory array associate circuitry 102 necessary for the operation of writing data into the memory array 101 included in each of the repeating units 203, and reading data from the memory array 101. Circuits that can be shared by the repeating units 103 are collected in the peripheral circuitry 104. The circuits that are shared by the repeating units 103 are collected in the peripheral circuitry 104, thereby enabling an increase in the area when the number of repeating units 103 in the SRAM macro 506 increases to be suppressed.

The power switch groups 105 are switches for disconnecting the external power wires VDDC for supplying power from the semiconductor device 500 to the SRAM macro 506 and the internal power wires VDD of the SRAM macro 506 according to the power-off signal SWD. The switches of the power switch groups 105 are configured by, for example, multiple PMOS transistors.

Figure 3:
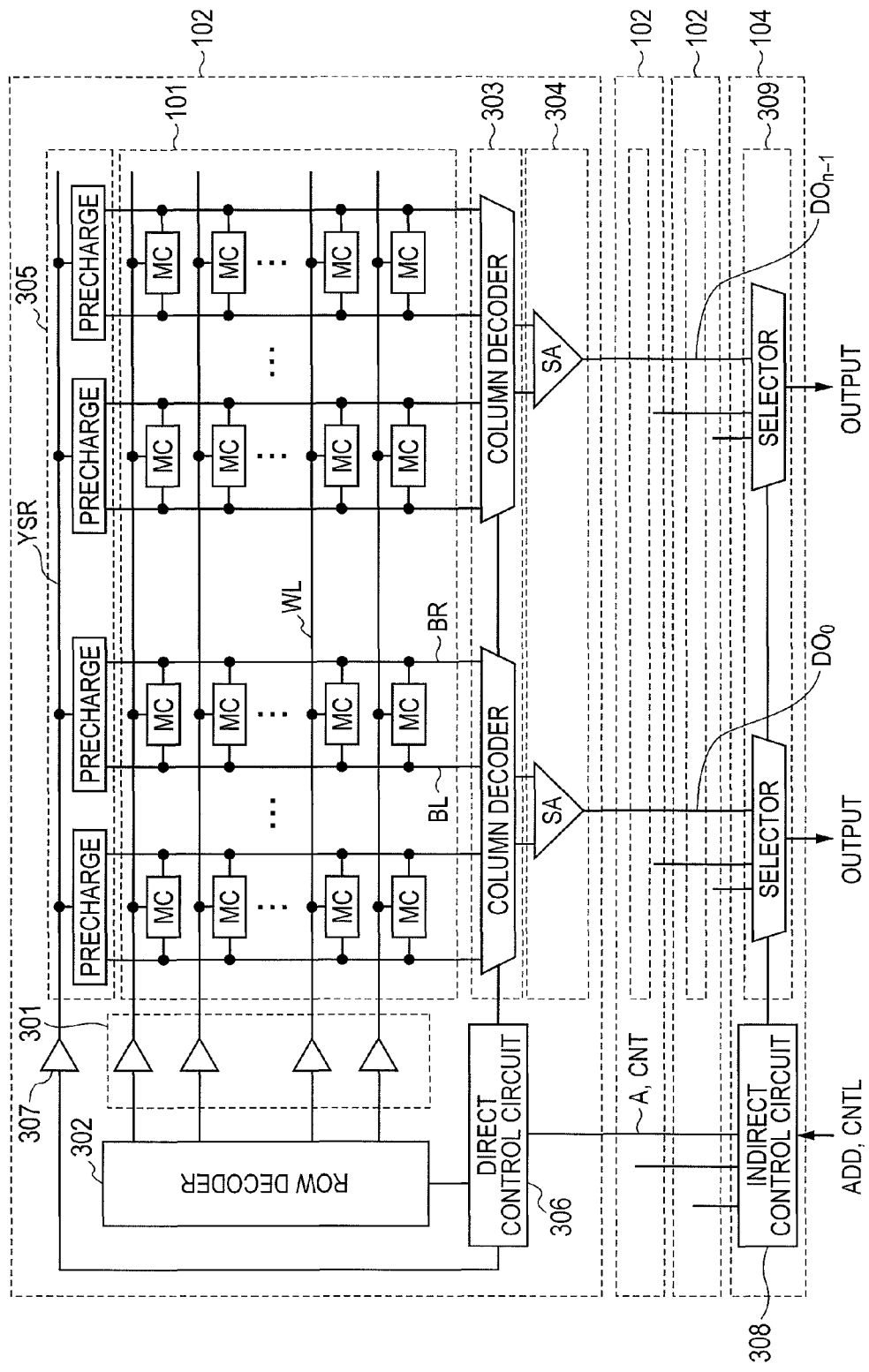
FIG. 3 is a block diagram illustrating a main portion of a memory array, a memory array associate circuitry, and a peripheral circuitry included in the SRAM macro according to a first embodiment of the present invention.

Hereinafter, an example of the peripheral circuit of the SRAM macro 506 will be described. FIG. 3 illustrates a block diagram of a main portion of the repeating units 103 and the peripheral circuitry 104 of the SRAM macro exemplified as the layout 100 in FIG. 1.

In the memory array 101 that is an array of the memory cells (MC), multiple word lines WL are arranged to extend in a row direction (in a lateral direction of FIGS. 1, 3, and 4), and connected to the array of the memory cells. Also, in the memory array 101, multiple bit line pairs BL and BR are arranged to extend in a column direction (in a longitudinal direction of FIGS. 1, 3, and 4), and connected to the array of the memory cells. The rows of the memory array 101 are selected by the word lines WL. The columns of the memory array 101 are selected by the bit line pairs BL and BR.

Figure 17:
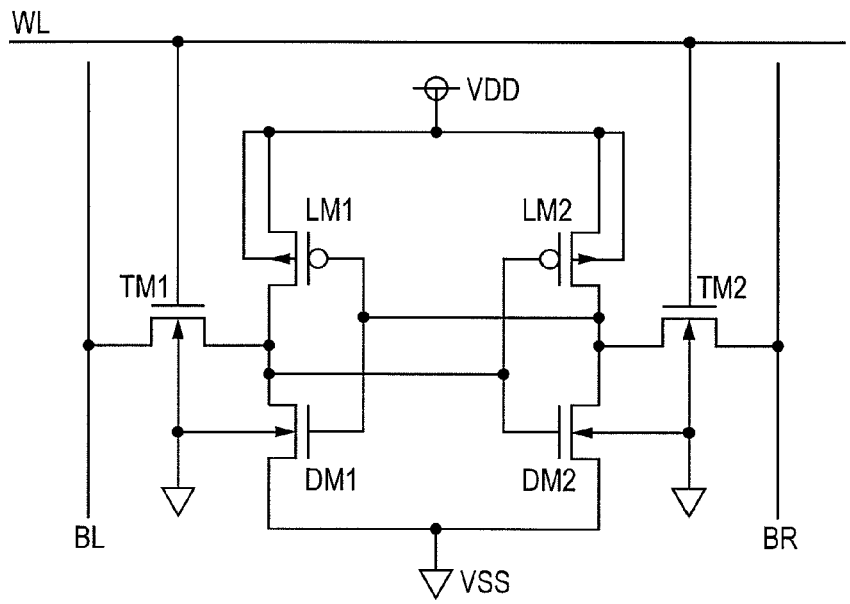
FIG. 17 is a circuit diagram illustrating an example of a memory cell MC.

FIG. 17 illustrates an example of the memory cells (MC). Each of the memory cells includes a first inverter circuit configured by a load p-channel MOS transistor LM1 and a drive n-channel MOS transistor DM1, and a second inverter circuit configured by a load p-channel MOS transistor LM2 and a drive n-channel MOS transistor DM2. An output of the first inverter circuit is connected to an input of the second inverter circuit, and an output of the second inverter circuit is connected to an input of the first inverter circuit, thereby holding input information. The information is read and written by the bit lines BL and BR through NMOS transistors TM1 and TM2 of transfer gates connected to output nodes of the first inverter circuit and the second inverter circuit. The memory cell for reading or writing is selected by the word line WL.

As illustrated in FIG. 3, the word lines WL is connected with a row decoder 302 through a word line driver circuit 301. The row decoder 302 selects a corresponding one of the plural word lines WL on the basis of a row address signal. The plural bit line pairs BL and BR are connected with a column decoder circuit 303. The column decoder circuit 303 selects a corresponding pair of the plural bit line pairs BL and BR on the basis of a column address signal.

A sense amplifier circuit 304 is configured by multiple sense amplifiers SA. The sense amplifier circuit 304 detects and amplifies data read from the memory array 101 through the column decoder circuit 303, and outputs the amplified data as output data $DO_0$ to $DO_{n-1}$.

A precharge circuit 305 precharges the bit, line pairs BL and BR to, for example, a power supply potential before conducting reading or writing operation. The precharge circuit 305 executes precharging operation on the basis of a precharge signal YSR. As one example, the precharge circuit 305 precharges-the bit line pairs BL and BR to the power supply potential when the precharge signal YSR is low level. On the other hand, the precharge circuit 305 cancels precharge when the precharge signal YSR is high level. The precharge signal is supplied to the precharge circuit 305 from a direct control circuit 306 through a precharge driver 307.

The direct control circuit 306 controls the respective circuits within each of the repeating units 103 that are the functional blocks repetitively arranged within the SRAM macro 506. The direct control circuit 306 receives an address decode signal A or a control signal CNT from an indirect control circuit 308. The direct control circuit 306 generates row address signal to be supplied to the row decoder 302 and the column address signal to be supplied to the column decoder circuit 303 on the basis of the address decode signal A input from the indirect control circuit 308. Also, the direct control circuit 306 generates the precharge signal YSR to be supplied to the precharge circuit 305, for example, on the basis of the control signal CNT. The output data $DO_0$ to $DO_{n-1}$ read from the memory array associate circuitry 102 is input to the peripheral circuitry 104.

The indirect control circuit 308 receives an address input signal ADD from the external of the SRAM macro 506, or a control input signal CNTL. The indirect control circuit 308 decodes address input signal ADD, and supplies the address decode signal A to the direct control circuit 306. Also, the indirect control circuit 308 supplies the control signal CNT taking logic to the direct control circuit 306, for example, in response to the control input signal CNTL input to the SRAM macro 506. Further, the indirect control circuit 308 supplies an output select signal based on the address input signal ADD to an output selector circuit 309. The output selector circuit 309 selects one of the output data $DO_0$ to $DO_{n-1}$ from the sense amplifier circuits 304 of the plural memory array associate circuitries 102 on the basis of the output select signal, and outputs the selected output data as output data of the SRAM macro 506.

In the main portion of the peripheral circuit of the SRAM macro 506 illustrated in FIG. 3 as described above, the word line driver circuit 301, the row decoder 302, the column decoder circuit 303, the sense amplifier circuit 304, the precharge circuit 305, the direct control circuit 306, and the precharge driver 307 belong to the memory array associate circuitry 102. The indirect control circuit 308 and the output selector circuit 309 belong to the peripheral circuitry 104.

Figure 2:
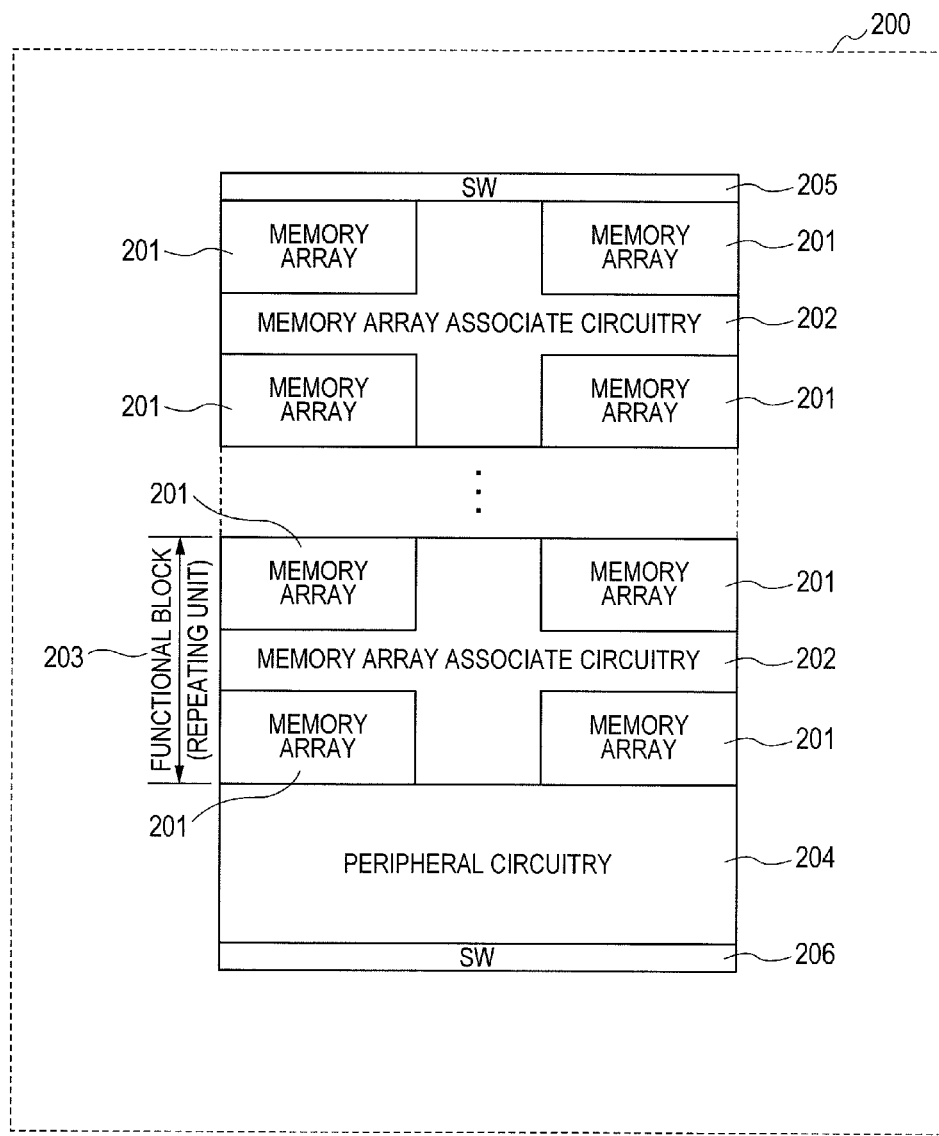
FIG. 2 is a schematic diagram illustrating a layout of the SRAM macro which has been studied by the present inventors.
Figure 4:
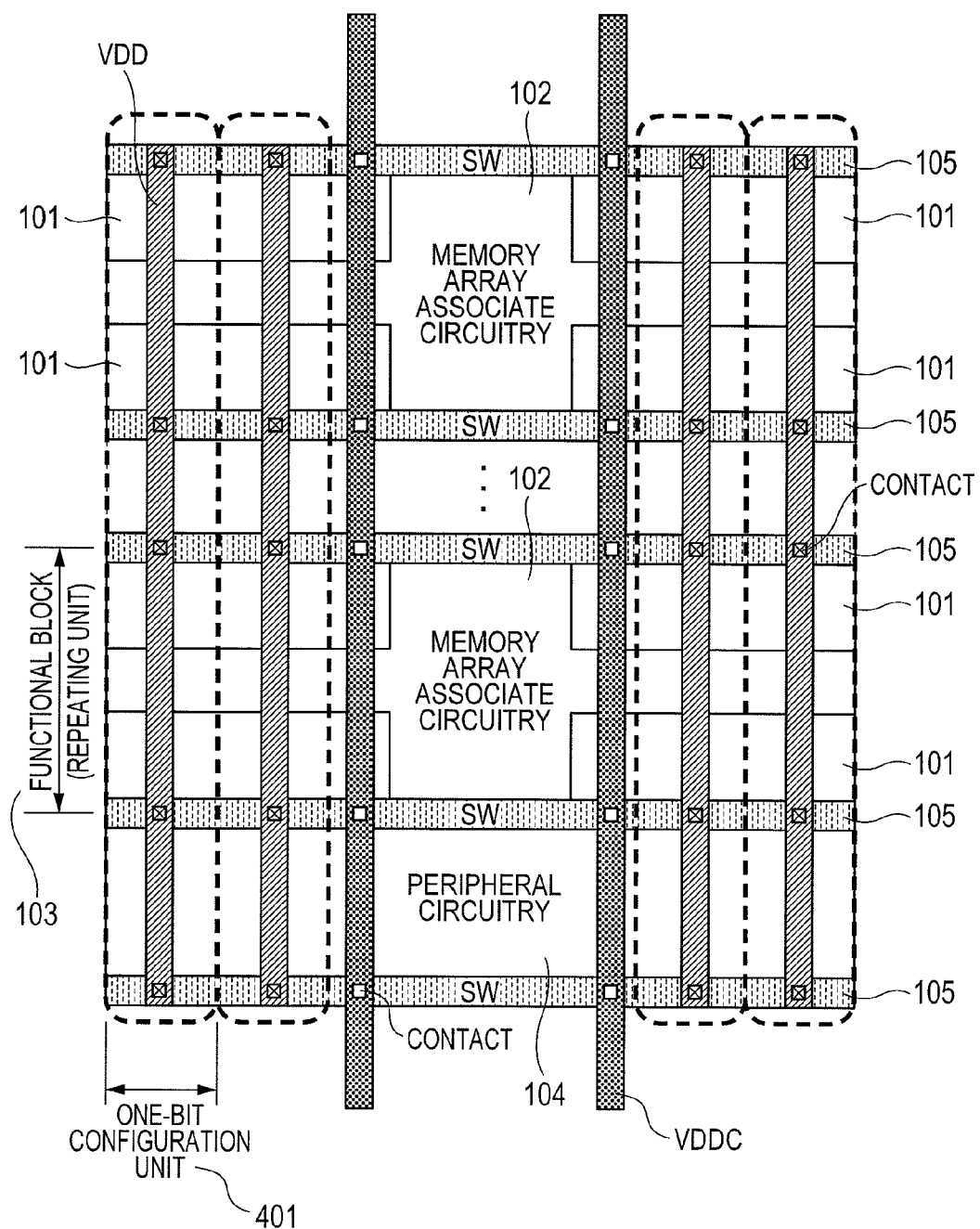
FIG. 4 is a diagram illustrating a wiring layout of power switch groups and internal power wires according to the embodiment.

FIG. 4 is a wiring layout diagram of the power switch groups 105 as well as the internal power wires VDD for supplying power to the memory arrays. 101, the memory array associate circuitries 102, and the peripheral circuitry 104 in the SRAM macro 506 illustrated in FIG. 1. The power switch groups 105 are distributed for each of the repeating units 103, and the power wires are arranged in the same longitudinal direction as the direction along which the bit lines are arranged. The power switch groups 105 are distributed for each of the repeating units 103 that are the functional blocks so that even if the number of repeating units 103 increases, a wire length of the internal power wires VDD that have mediated the power switch can be shortened within a range of the length of the repetition unit. Accordingly, a time and effort for changing the specification of wiring every time the storage capacity is changed is saved, and the design of the semiconductor device is facilitated as compared with a case in which the power switches are concentrated at the upper and lower positions as illustrated in FIG. 2. Also, in the layout 100, the functional block 103 including the memory array 101, the memory array associate circuitry 102, and the power switch groups 105 that disconnects the memory array 101 and the memory array associate circuitry 102, and the power wires from the semiconductor device 500 is set as a unit of the layout. Therefore, there is no need to again design the power switches taking a power impedance into reconsideration. Accordingly, the design of the SRAM macro that can change the storage capacity with a change in the number of repeating units 103 can be facilitated. That is, the semiconductor device according to an embodiment of the present invention can easily change the storage capacity with a change in the number of repeating units to design the semiconductor device.

The external power wires VDDC connected to the SRAM macro 506 from the semiconductor device 500 are arranged in the longitudinal direction as illustrated in FIG. 4, and connected to the internal power wires VDD through the power switch groups 105. In FIG. 4, the external power wires VDDC are arranged in only the longitudinal direction, that is, a direction along which the bit lines are arranged. However, the external power wires VDDC may be, for example, meshed, and are not limited to the example of FIG. 4. For example, a wiring layer used for the external power wire VDDC may be identical with the internal power wire VDD. Also, the external power wire VDDC may use wires on a layer upper than that of the wires used for the SRAM macro 506.

In this embodiment, in the SRAM macro 506, a circuit corresponding to input/output of One bit in data width, and a memory array connected to that circuit through the bit line are called "one-bit configuration unit 401". In this embodiment, multiple the one-bit configuration units 401 in FIG. 4 is arranged in a lateral direction of the SRAM macro 506, that is, in a direction along which the word lines are arranged to realize an arbitrary bit width configuration. The internal power wire VDD is arranged in correspondence with each of the one-bit configuration units 401. The storage capacity of the SRAM macro is determined according to a word length and a bit width corresponding to the data width. In this embodiment, the word length corresponds to the configuration in the longitudinal direction of FIG. 4, and the bit width corresponds to the number of one-bit configuration units 401 which are arranged in the lateral direction. In the power consumption of the SRAM macro 506, when the word length is compared in size with the bit width, the bit width is larger in the number of activated elements. For that reason, in the power consumption of the SRAM macro 506, the dependence of the bit width is larger than the dependence of the word length. Accordingly, in the SRAM macro 506, the number of repeating units 103 is increased in correspondence with the extended word length with the result that the capacity of the memory can be increased while suppressing an increase in the power consumption.

The power switch groups 105 included in the one-bit configuration unit 401 of FIG. 4 are arranged at both ends of the direction along which the bit lines are arranged for each of the repeating units 103. For that reason, when the one-bit configuration units 401 are arranged, the power switch groups 105 are also arranged together, and even if the SRAM macro 506 realizes an arbitrary bit width, the power structure of the one-bit configuration unit 401 having the wiring of the internal power wire VDD and the power switch groups 105 are repetitively arranged. For that reason, if a power impedance is designed by the one-bit configuration unit 401, an arbitrary bit width can be easily realized by arranging the one-bit configuration units 401 without redesigning the power switch.

Figure 6:
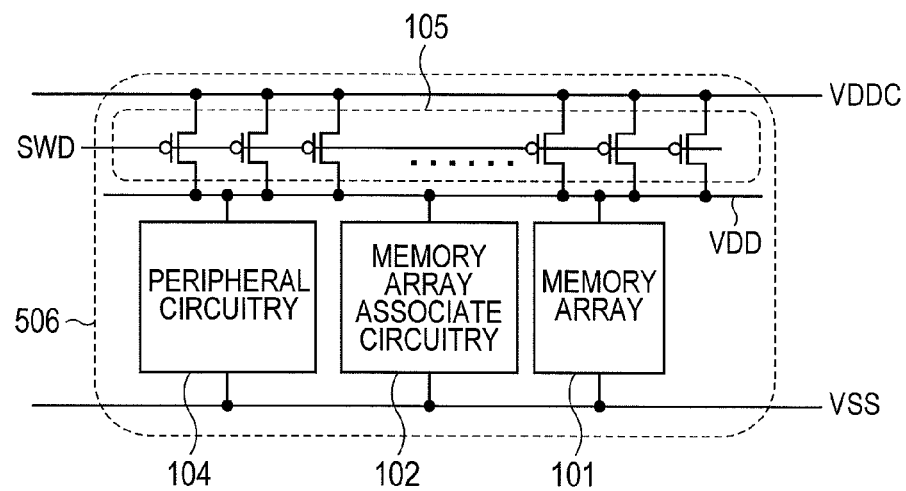
FIG. 6 is a circuit connection diagram illustrating an example of a connection relationship of the power switch groups.

FIG. 6 illustrates a circuit connection diagram focusing attention on the power switch groups 105. As illustrated in FIG. 6, the memory array 101 and the memory array associate circuitry 102 are connected to the wiring of the internal power wire VDD of the SRAM macro 506, and the wiring of a potential of VSS which is, for example, the ground. The wiring of the internal power wire VDD is connected to the wiring of the external power wire VDDC that supplies power to the SRAM macro 506 from the semiconductor device 500 through the power switch group 105 controlled by the power-off signal SWD. FIG. 6 illustrates only a connection relationship of the memory array 101 and the memory array associate circuitry 102, and the power switch groups 105. The power switch group 105 operates integrally according to the power-off signal SWD to power off the SRAM macro 506 including the peripheral circuitry 104 not illustrated in FIG. 6.

Figure 7:
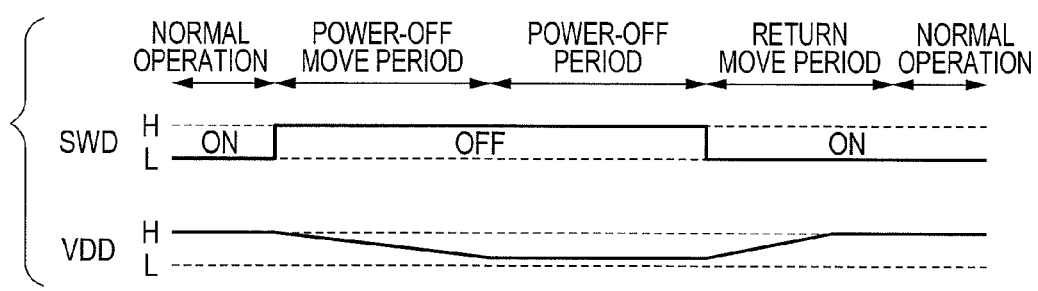
FIG. 7 is a diagram illustrating a timing chart from a normal operation state of the SRAM macro to a power-off state and a timing chart of return from the power-off state to the normal operation state according to an example of the present invention.

The power-off operation of the circuit illustrated in FIG. 6 will be described with reference to a timing chart of FIG. 7. When the normal operation state is moved to the power-off state, for example, if the power switch group 105 is configured by PMOS transistors, the power-off signal SWD generated by the power-off control block 505 arranged in the semiconductor device 500 changes from the low level to the high level. When the PMOS transistors configuring the power switch group 105 turn off according to the power-off signal. SWD, the internal power wire VDD of the SRAM macro 506 is separated from the connected external power wire VDDC, and electric charge is extracted by a leak current of the SRAM macro 506 whereby a potential of the internal power wire VDD drops. Finally, the potential of VDD drops down to a potential close to VSS determined according to an off leak current flowing in the SRAM macro 506 through the power switch group 105 that is in an off state. In the SRAM macro 506, because the current consumption of the power-off state is as small as about a few tenths of the consumption of current flowing in a standby mode of the normal operation state, the power-off operation is conducted in a period where the semiconductor device 500 does not use the SRAM macro 506, thereby enabling the power consumption of the semiconductor device 500 to be reduced. In the period where the semiconductor device 500 does not use the SRAM macro 506, the power-off signal SWD is controlled to be high level to, maintain the power-off state.

When the power is returned to the normal operation state from the power-off state, for example, if the power switch group 105 is configured by the PMOS transistors in the same manner as described above, the power-off signal SWD generated by the power-off control block 505 arranged in the semiconductor device 500 is changed from the high level to the low level. When the PMOS transistor is changed from the off state to the on state, the potential of the internal power wire VDD in the SRAM macro 506 gradually increases. The internal power wire VDD finally increases up to a potential substantially equal to the potential of the connected external power wire VDDC, and becomes the normal operation state.

Second Embodiment

In this embodiment, a case in which the memory array 101 and the other circuits are powered off, independently, will be described. Also, differences from the first embodiment will be mainly described.

Figure 9:
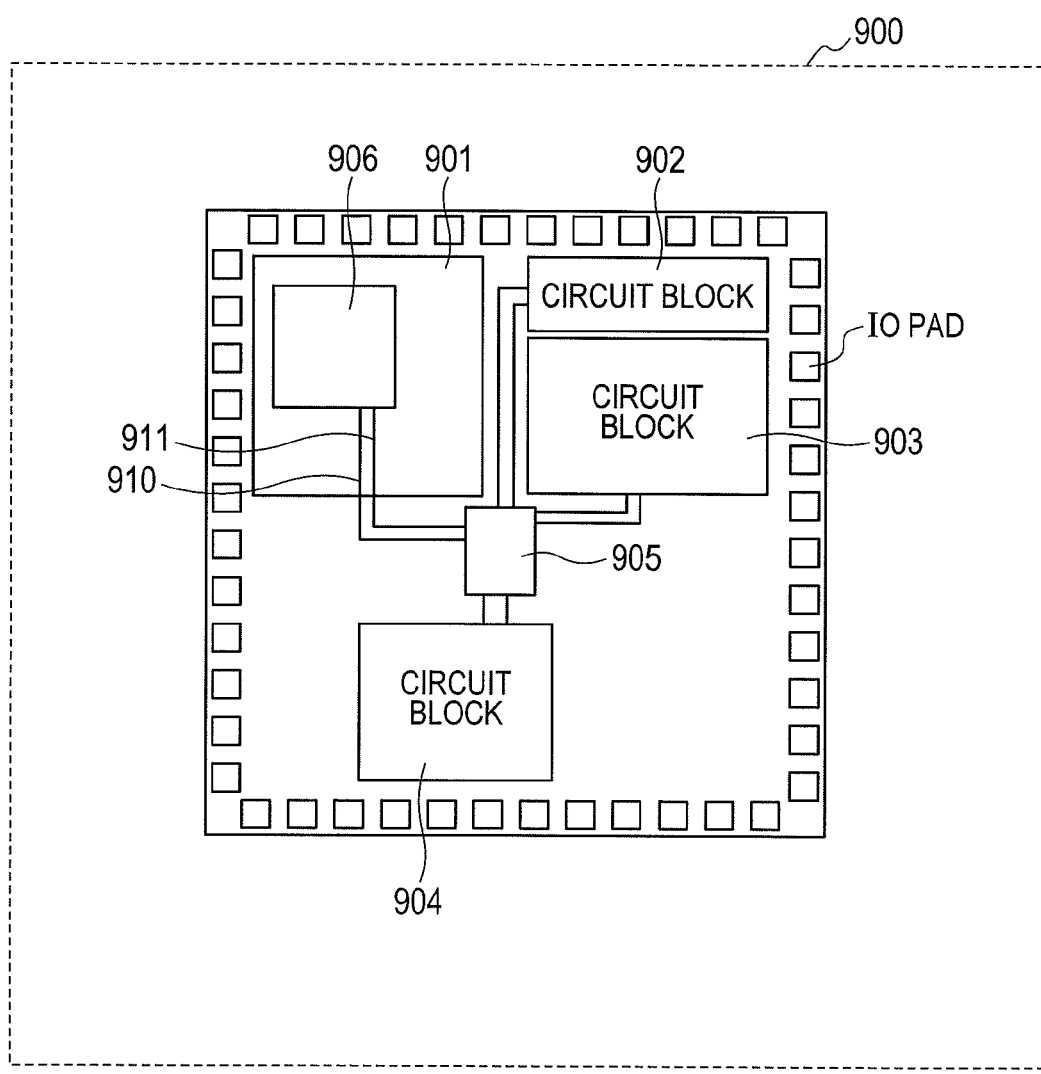
FIG. 9 is a diagram illustrating a semiconductor device according to an embodiment of the present invention.

FIG. 9 illustrates a layout placement example of a semiconductor device 900 according to this embodiment. The semiconductor device 900 includes multiple circuit blocks 901 to 904, and a power-off control block 905. The circuit block 901 includes an SRAM macro 906 that is a memory macro. Because the power-off control block 905 and the SRAM macro 906 conduct the power-off control, a memory array power-off signal line 910 that transmits a memory array power-off signal SWMA and a peripheral circuit power-off signal line 911 that transmits a peripheral circuit power-off signal SWMP are connected to each other.

The memory array power-off signal SWMA and the peripheral circuit power-off signal SWMP are generated by the power-off control block 905. As an example, when the PMOS transistors are used as the power switches for powering off the SRAM macro 906, the power-off control block 905 sets the memory array power-off signal SWMA and the peripheral circuit power-off signal SWMP to a signal of the low level which is a VSS potential in the normal operation, so as to supply power to the SRAM macro 906 from the power wire. In order to move to the power-off state for saving the power of the semiconductor device 900, the memory array power-off signal SWMA and the peripheral circuit power-off signal SWMP are set to a signal of the high level which is a VDDC potential to disconnect the SRAM macro 906 and the power wire.

When the state is moved to the power saving state to hold a memory of the SRAM macro 906, the memory array power-off signal SWMA is set to a signal of the low level that is the VSS potential, and the peripheral circuit power-off signal SWMP is set to the high level that is the VDDC potential, and power is supplied to the memory array 101 from the power wire to hold the stored information.

A block diagram for illustrating the reading or writing operation of the SRAM macro 906 is identical with that in FIG. 3 described in the first embodiment, and therefore will be omitted.

Figure 8:
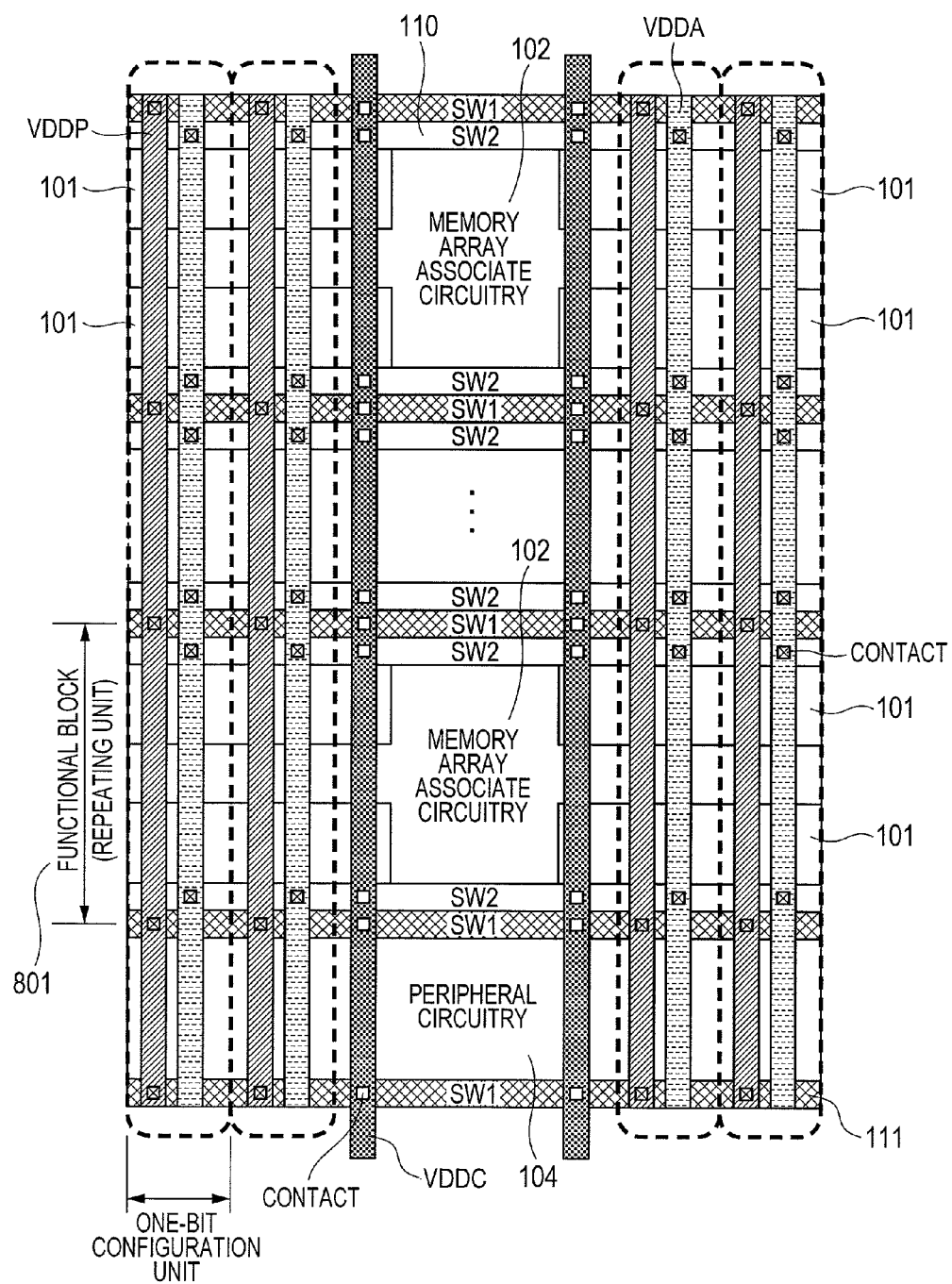
FIG. 8 is a diagram illustrating a wiring layout of the power switch groups and the internal power wires according to the embodiment.

FIG. 8 illustrates an example of a power wiring layout of the SRAM macro 906 according to a second embodiment. Each memory array power switch group 110 and each peripheral circuit power switch group 111 are distributed at upper and lower positions of a repeating unit 801. The power wires are arranged in the same direction as a direction along which the bit lines are disposed, and memory array power wires VDDA connected with the memory array power switch groups 110, and peripheral circuit power wires VDDP connected with the peripheral, circuit power switch groups 111 are provided. When the memory array power switch groups 110 and the peripheral circuit power switch groups 111 are distributed for each of the repeating units 801 that are the functional blocks, even if the number of the repeating units 801 is increased, the memory array power wires VDDA and the peripheral circuit power wires VDDP, which are internal power wires that mediate the power switches, can be shortened within a range of the length of the repeating unit. As a result, a time and effort for changing the specification of wiring every time the storage capacity is changed is saved, and the design of the semiconductor device is facilitated as compared with a case in which the power switches are concentrated at the upper and lower positions as illustrated in FIG. 2. As illustrated in FIG. 8, in the repeating unit 801, the functional block including the memory array 101, the memory array associate circuitry 102, and the memory array power switch group 110 and the peripheral circuit power switch group 111, which disconnect that disconnects the memory array 101 and the memory array associate circuitry 102, and the power wires from the semiconductor device 900 is set as a unit of the layout. Therefore, there is no need to again design the power switches taking a power impedance into reconsideration. Accordingly, the design of the SRAM macro that can change the storage capacity with a change in the number of repeating units 103 can be facilitated.

In FIG. 8, the power supplies are arranged in the longitudinal direction as an example. However, the external power wires VDDC may be, for example, meshed, and are not limited to the example of FIG. 8. For example, the wiring layer to be used may be identical with the internal power wire used in the SRAM macro 906. Also, the wiring layer may use wires on a layer upper than that of the wires used for the SRAM macro 906.

In an example illustrated in FIG. 8, the memory array 101 is disposed immediately below the wires at a left end or a right end of the figure. However, the memory array 101 is not disposed immediately below the wires in the center of the figure. For that reason, in the center of the figure, as compared the peripheral circuit power wires VDDP, even if the number of memory array power wires VDDA is small, there is no short of the power to be supplied. In this way, because the density of the required power wires is different in the SRAM macro 906, the density of the power wires may be changed within the SRAM macro 906 so that the number of peripheral circuit power wires VDDP is larger in the center portion, and the number of memory array power wires VDDA is larger above portions where the right and left memory arrays 101 are arranged.

Also, in order to easily realize an arbitrary bit width as in the first embodiment, the memory array power switch group 110 and the peripheral circuit power switch group 111 may be arranged for each one-bit configuration unit.

Figure 10:
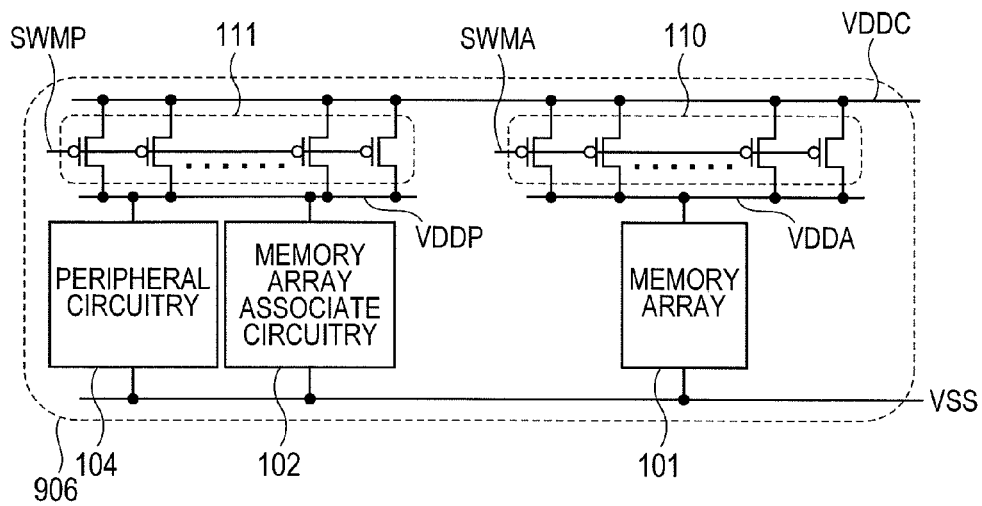
FIG. 10 is a circuit connection diagram illustrating an example of a connection relationship of the power switch groups.
Figure 11:
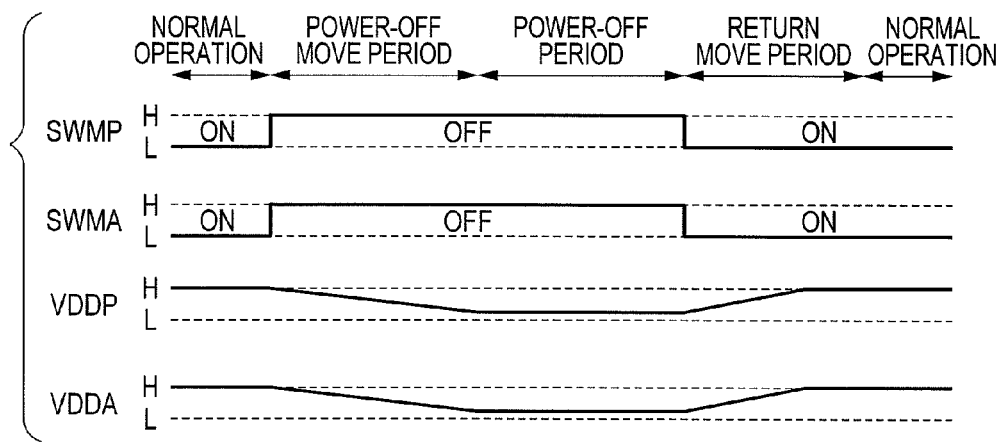
FIG. 11 is a diagram illustrating a timing chart from the normal operation state of the SRAM macro to the power-off state and a timing chart of return from the power-off state to the normal operation state according to an example of the present invention.

FIG. 10 is a circuit connection diagram focusing attention on the memory array power switch group 110 and the peripheral circuit power switch group 111. The power-off operation of the circuit illustrated in FIG. 10 will be described with reference to a timing chart of FIG. 11. When the normal operation state is moved to the power-off state, for example, if the memory array power switch group 110 and the peripheral circuit power switch group 111 are configured by PMOS transistors, the peripheral circuit power-off signal SWMP and the memory array power-off signal SWMA change from the low level to the high level. When the PMOS transistors configuring the memory array power switch group 110 and the peripheral circuit power switch group 111 turn off according to the peripheral circuit power-off signal SWMP and the memory array power-off signal SWMA, the VDDA and VDDP that are the internal power wires of the SRAM macro 906 are separated from the connected external power wire VDDC, and electric charge is extracted by a leak current of the SRAM macro 906, thereby dropping the potential. Finally, the potential of the VDDA and VDDP drops down to a potential close to the VSS which is determined according to the off leak current flowing in the SRAM macro 906 through the memory array power switch group 110 and the peripheral circuit power switch group 111 which are in an off state. In the period where the semiconductor device 900 does not use the SRAM macro 906, the peripheral circuit power-off signal SWMP and the memory array power-off signal SWMA are controlled to be high level to maintain the power-off state. In the SRAM macro 906, because the current consumption of the power-off state is as small as about a few tenths of the consumption of current flowing in a standby mode, the power-off operation is conducted in a period where the semiconductor device 900 does not use the SRAM macro 906, thereby enabling the power consumption to be reduced.

When the power is returned to the normal state from the power-off state, for example, if the memory array power switch group 110 and the peripheral circuit power switch group 111 are configured by the PMOS transistors in the same manner as described above, the peripheral circuit power-off signal SWMP and the memory array power-off signal SWMA are changed from the high level to the low level. When the PMOS transistor is changed from the off state to the on state, the potentials of the internal power wires VDDA and VDDP in the SRAM macro 906 gradually increase. The power wires VDDA and VDDP finally increases up to a potential substantially equal to the potential of the connected external power wire VDDC, and becomes the normal operation state.

Figure 12:
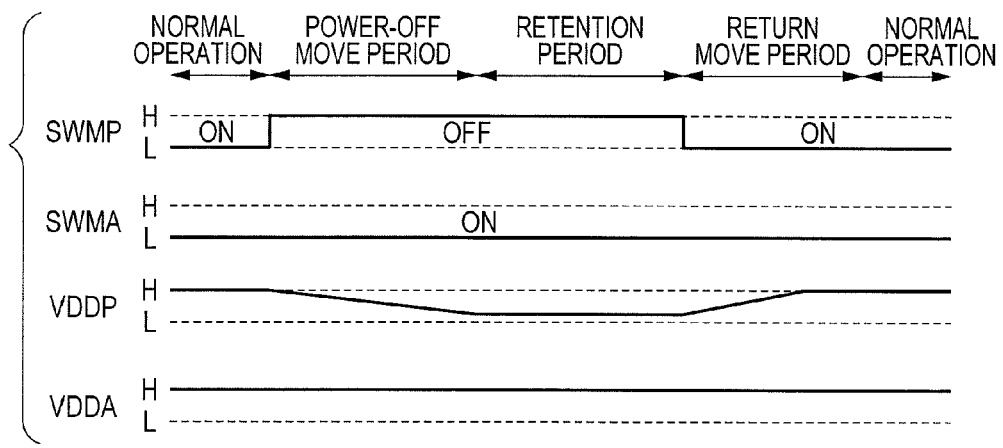
FIG. 12 is a diagram illustrating a timing chart from the normal operation state of the SRAM macro to a retention state and a timing chart of return from the retention state to the normal operation state according to an example of the present invention.

A description will be given of an example of retention operation of powering off the peripheral circuitry 104 and the memory array associate circuitry 102 without powering off the memory array 101 in order to maintain information stored in the SRAM macro 906 in the circuit of FIG. 10, with reference to a timing chart of FIG. 12.

When the normal operation state is moved to the retention state, for example, if the memory array power switch group 110 and the peripheral circuit power switch group 111 is configured by PMOS transistors, the peripheral circuit power-off signal SWMP changes from the low level to the high level. In this situation, the memory array power-off signal SWMA is kept to the low level.

When the PMOS transistors configuring the peripheral circuit power switch group 111 turn off according to the peripheral circuit power-off signal SWMP, the peripheral circuit power-off signal SWMP of the SRAM macro 906 is separated from the connected external power wire VDDC, and electric charge is extracted by a leak current of the SRAM macro 906 whereby a potential of the peripheral circuit power wires VDDP drops. Finally, the potential of the VDDP drops down to a potential close to VSS, which is determined according to an off leak current flowing in the SRAM macro 906 through the peripheral circuit power switch group 111 that is in an off state.

In a period of the retention state, the memory array power-off signal SWMA is continuously kept in the low level, the memory array power switch group 110 becomes in the on state, and the memory array power wires VDDA maintain the potential of the connected external power wire VDDC. In this situation, the SRAM macro 906 does not conduct the reading or writing operation. For that reason, the potential of the connected external power wire VDDC may be controlled so that the potential of the memory array power wires VDDA is reduced within a range where the memory array 101 can hold the information to reduce a leak current. Also, the memory array power-off signal SWMA may be controlled to a potential higher than the low level without changing the potential of the external power wire VDDC so that the potential of the memory array power wires VDDA is changed within a range where the memory array 101 can hold the information to reduce the leak current. Because the current consumption of the retention state is as small as about a fraction of the consumption of current flowing in the standby mode in the SRAM macro 906, the retention state is maintained in a period where the semiconductor device 900 does not use the SRAM macro 906, thereby enabling the power consumption to be reduced.

When the power is returned to the normal operation state from the retention state, for example, if the memory array power switch group 110 and the peripheral circuit power switch group 111 are configured by the PMOS transistors in the same manner as described above, the peripheral circuit power-off signal SWMP is changed from the high level to the low level. In this state, the memory array power-off signal SWMA is held in the low level.

When the PMOS transistor is changed from the off state to the on state, the potential of the peripheral circuit power wires VDDP in the SRAM macro 906 gradually increases. The peripheral circuit power wires VDDP finally increase up to a potential substantially equal to the potential of the connected external power wire VDDC, and becomes the normal operation state.

In the return from the retention state to the normal state, when the peripheral circuit power-off signal SWMP is changed from the high level to the low level, a load connected to the connected external power wire VDDC instantaneously change. Therefore, noise occurs. In order to suppress this noise, for example, if the peripheral circuit power-off signal SWMP is configured by PMOS transistors, the peripheral circuit power-off signal SWMP is gradually changed from the high level to the low level, and the peripheral circuit power-off signal SWMP is gradually changed from the high level to the low level, and the peripheral circuit power wires VDDP is gradually returned to a potential of the connected VDDC, thereby enabling the noise occurring in the external power wire VDDC to be reduced.

Third Embodiment

As a third embodiment, a description will be given of a case in which the potential of the power supply connected to the SRAM macro 906 in the second embodiment is different between the power supply of the memory array 101 and the power supply of the other peripheral circuits. Hereinafter, differences from the first embodiment or the second embodiment will be mainly described. A block diagram for illustrating the reading or writing operation is identical with FIG. 3 described in the first embodiment, and therefore will be omitted. When the signal is transmitted or received between different power areas, a level shifter circuit is appropriately used in the word line driver circuit 301 provided in, for example, the memory array associate circuitry 102.

Figure 13:
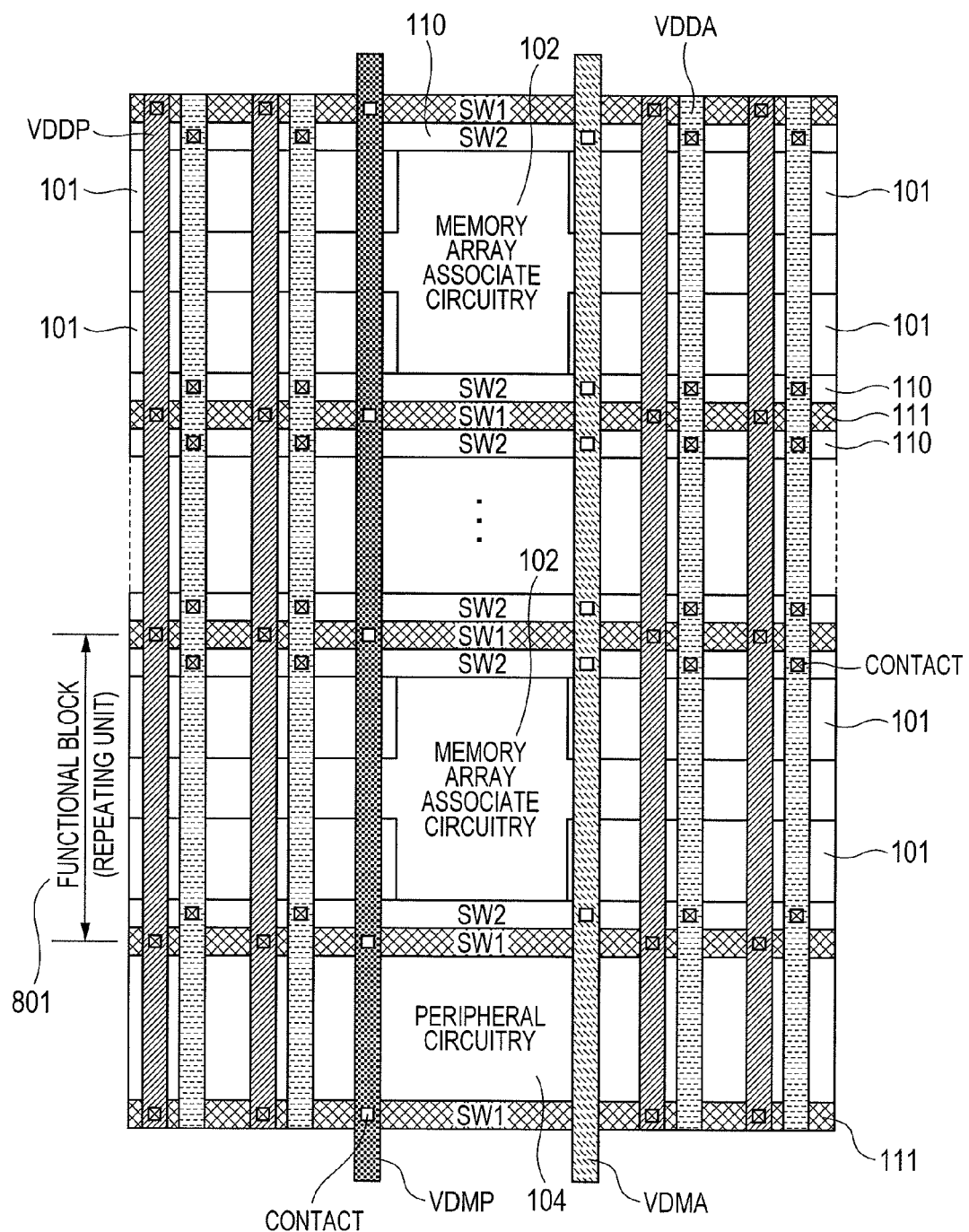
FIG. 13 is a diagram illustrating a wiring layout of the power switch groups and the internal power wires according to the embodiment.

FIG. 13 illustrates an example of a power wiring layout in the SRAM macro 906 according to the third embodiment. An example of the power wiring layout in the SRAM macro 906 according to the third embodiment is identical with that in FIG. 8 described in the second embodiment, and the power wires are arranged in the same longitudinal direction as the direction along which the bit lines are arranged. The memory array power switch groups 110 and the peripheral circuit power switch groups 111 are distributed for each of the repeating units 801, to thereby realize a reduction in the respective power impedances. Referring to FIG. 13, the memory array power wires VDDA and the peripheral circuit power wires VDDP are arranged in the same manner as that in FIG. 8 described in the second embodiment.

A memory array external power wire VDMA which is connected from the semiconductor device 900 is connected to the memory array power wires VDDA through the memory array power switch group 110. The memory array power switch group 110 is controlled by the memory array power-off signal SWMA. A peripheral circuit external power wire VDMP is connected to the peripheral circuit power wires VDDP through the peripheral circuit power switch group 111. The peripheral circuit power switch group 111 is controlled by the peripheral circuit power-off signal SWMP. In FIG. 13, as an example, the memory array external power wire VDMA and the peripheral circuit external power wire VDMP are arranged in the longitudinal direction. However, the wiring layer to be used may be identical with that of the internal power wires in the SRAM macro 906, or may use wires on a layer upper than that of the wires used in the SRAM macro 906. In this situation, it is assumed that the peripheral circuit external power wire VDMP and the memory array external power wire VDMA are different in potential from each other.

As an example, when PMOS transistors are used for the memory array power switch group 110 and the peripheral circuit power switch group 111, an n-well different in the potential is adjacent when the power switches are arranged. In general, there is a need to always separate the elements between the n-wells forming the PMOS transistors different in power domain, and a boundary portion of the n-wells requires an isolation area of the elements dozens of times as large as the normal wiring interval. When the elements are not separated, the n-wells different in the potential contact each other, and the n-wells of the different potential are electrically short-circuited. For that reason, as compared with the second embodiment, the area efficiency is deteriorated by the required isolation area of the elements.

In this embodiment, in two, kinds of power supplies connected to the SRAM macro 906, the potential of the memory array external power wire VDMA is always a potential of the peripheral circuit external power wire VDMP or higher, and the n-wells are commonalized, thereby enabling the isolation area of the elements to be unrequired. Accordingly, an area of the SRAM macro 906 can be reduced.

Figure 14:
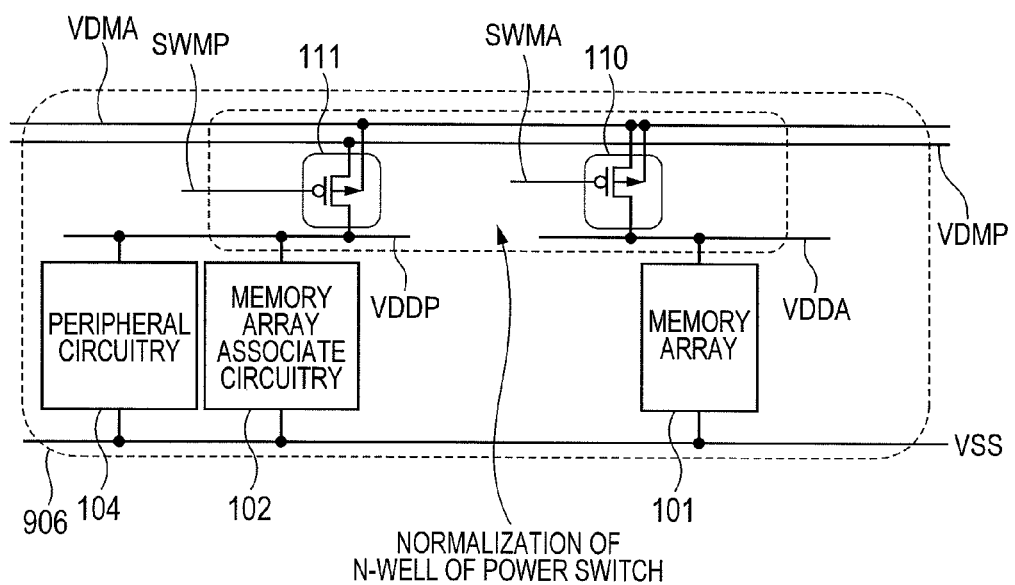
FIG. 14 is a circuit connection diagram illustrating an example of a connection relationship of the power switch groups.

A description will be given of the communalization of the n-wells with reference to a circuit connection diagram focusing attention on the memory array power switch group 110 and the peripheral circuit power switch group 111 as illustrated in FIG. 14. In this embodiment, as illustrated in FIG. 13, the memory array power switch groups 110 and the peripheral circuit power switch groups 111 are arranged for each of the repeating units 801. In this situation, as illustrated in FIG. 14, the adjacent n-wells are commonalized, and the potential of the n-wells is fixed by the memory array external power wire VDMA connected from the semiconductor device 900. In general, the PMOS transistor includes a four-terminal element of source-drain-gate-body. In order to prevent a current from flowing into a substrate configuring the PMOS transistor, the body must be biased so that both of the source and the drain become positive.

In this embodiment, the source of the memory array power switch group 110 is connected with the memory array external power wire VDMA, and the source of the peripheral circuit power switch group 111 is connected with the peripheral circuit external power wire VDMP. The communalization of the n-wells corresponds to the connection of the body, and in order that the PMOS transistor configuring each power switch is biased so that both of the source and the drain become always positive, the memory array external power wire VDMA that is always higher in potential between two kinds of power supplies may be connected to the PMOS transistor. For that reason, the memory array external power wire VDMA is connected to the body so that no current flows into the n-wells of both the power switches. As a result, the isolation area of the elements is not required, and the area of the SRAM macro 906 can be reduced.

In addition to the above advantage that the area can be reduced, because the n-wells can be fixed at the potential higher than the peripheral circuit power domain, a back bias is equivalently applied to the peripheral circuit power switch group 111. The off leak current flowing in turning off the peripheral circuit power switch group 111 is reduced. In the power-off state and the retention state, the current consumption of the semiconductor device 900 can be reduced.

Fourth Embodiment

In this embodiment, a description will be given of a case in which power-off operation is conducted for each of the plural functional blocks. Hereinafter, differences from the first embodiment will be mainly described. A block diagram for illustrating the reading or writing operation is identical with FIG. 3 described in the first embodiment, and therefore will be omitted.

Figure 15:
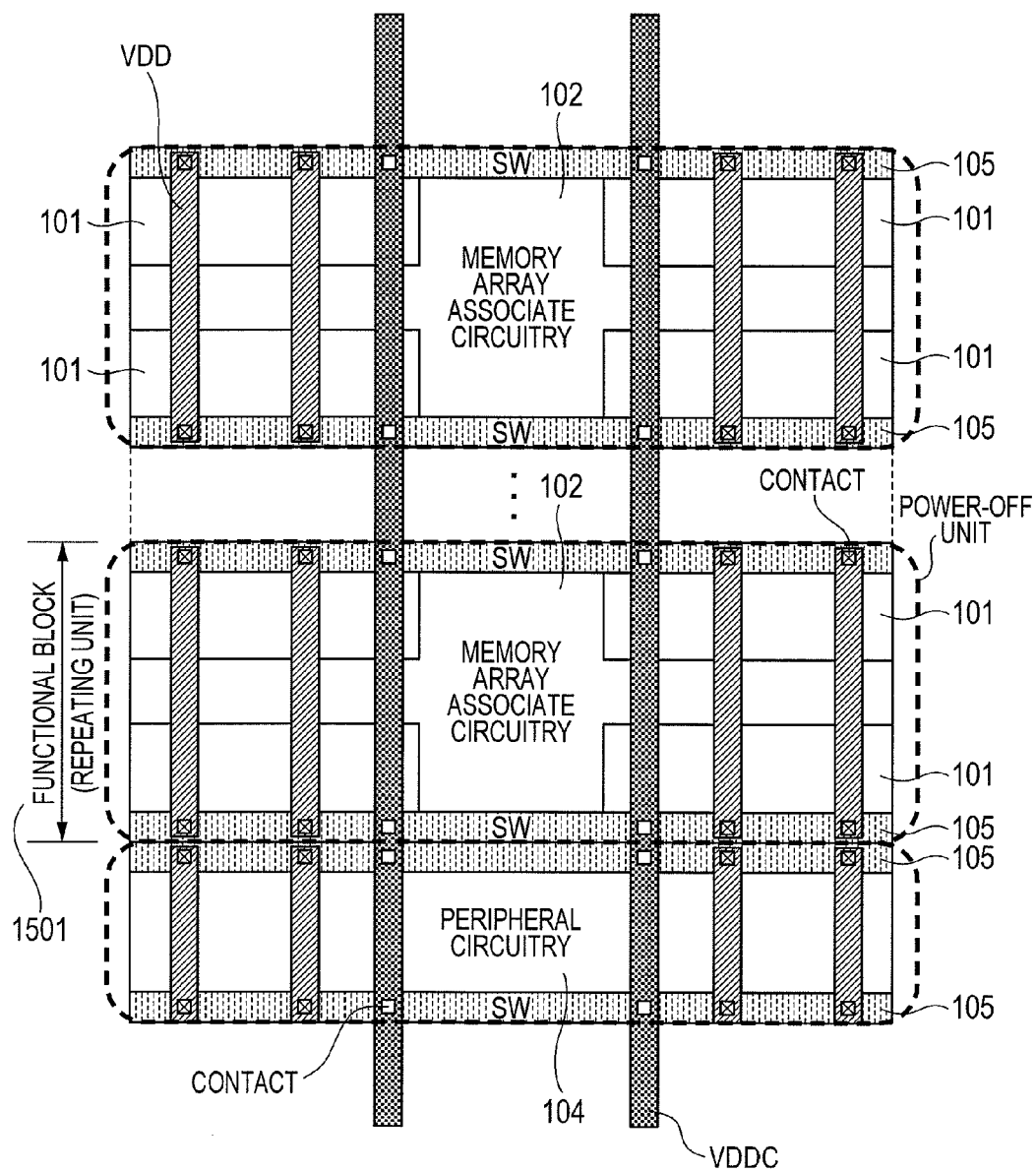
FIG. 15 is a diagram illustrating a wiring layout of the power switch groups and the internal power wires according to the embodiment.

FIG. 15 illustrates an example of a power wiring layout in the SRAM macro 506 according to the fourth embodiment. The power wiring layout in the SRAM macro 506 according to the fourth embodiment is identical with that in the first embodiment in that there is provided a repeating unit 1501 which is a functional block having the memory array 101 and the memory array associate circuitry 102, and the peripheral circuitry 104 is provided. An area of the repeating unit 1501 is a range in which a boundary is provided between two arranged power switch groups 105 as illustrated in FIG. 15. Also, the internal power wires VDD are separated for each of the repeating units 1501, and power-off operation is conducted for each of the repeating units 1501. Also, in the peripheral circuitry 104, the internal power wires VDD are separated as with the repeating units 103, and the power-off operation is conducted, independently.

Figure 16:
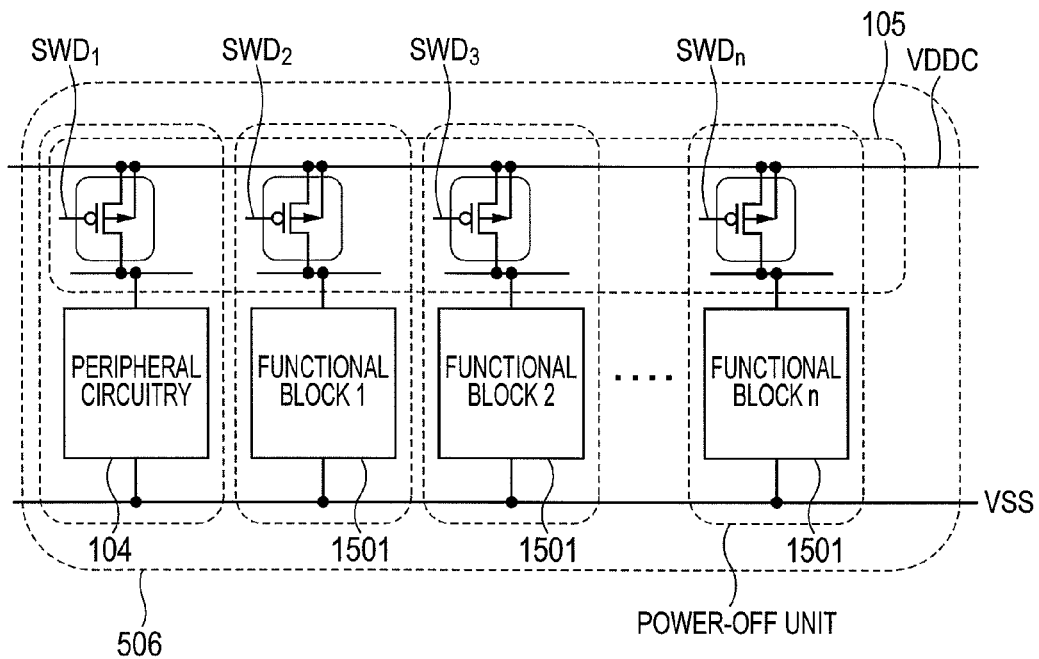
FIG. 16 is a circuit connection diagram illustrating an example of a connection relationship of the power switch groups.

FIG. 16 is a circuit connection diagram focusing attention on the power switch groups 105. An independent power switch is provided for each of the repeating units 103, and is connected with power-off signals $SWD_1$ to $SWD_n$ that control the respective power switches. Referring to FIG. 16, power switches connected with the power-off signal $SWD_1$ are the power switch groups 105 arranged at the upper and lower positions of the peripheral circuitry 104 in FIG. 15, and power switches connected with the power-off signal $SWD_2$ are the power switch groups 105 arranged at the upper and lower positions of the functional block 1501 in FIG. 15.

In this embodiment, the power-off signals $SWD_1$ to $SWD_n$ are generated by the power-off control block 505, and connected to the SRAM macro 506. As illustrated in FIG. 16, in the semiconductor device according to this embodiment, the SRAM macro 506 turns off a corresponding power switch group 105 according to the power-off signals $SWD_1$ to $SWD_n$ connected to the respective power switch groups 105 to conduct the power-off.

As an example, a description will be given of a case in which only a functional block A, which is one of the plural functional blocks 103 configuring the SRAM macro 506, is moved to the power-off. For example, if the power switch groups 105 are configured by the PMOS transistors, the power-off signal $SWD_2$ that is a signal for powering off a functional block 1 among the power-off signals $SWD_1$ to $SWD_n$ generated by the SRAM macro 506 arranged in the semiconductor device is changed from the low level to the high level. The PMOS transistors configuring the power switch group 105 turn off when the power-off signal $SWD_2$ becomes high level. The internal power wire VDD of the functional block 1 for powering off is separated from the connected external power wire VDDC, and electric charge is extracted by a leak current with the result that the potential of the internal power wire VDD drops. Finally, the potential of the VDD drops down to a potential close to VSS, which is determined according to the off leak current through the power switch that is in an off state this situation, in the other functional blocks that do not conduct the power-off, the corresponding power-off signals $SWD_1$ to $SWD_n$ are kept in the low level, and maintained in the normal state. Because the current consumption in the current power-off state is smaller than the consumption of current flowing in the standby mode, the functional block 1 not used in the semiconductor device is powered off so that the power consumption can be reduced. In a period where an appropriate functional block 1 is not used in the SRAM macro 506, the corresponding power-off signal $SWD_2$ is controlled to the high level to maintain the power-off state.

When the power is returned to the normal operation state from the power-off state, for example, if the power switch groups 105 are configured by the PMOS transistors in the same manner as described above, the power-off signal $SWD_2$ that is a signal for returning the power supply of the functional block 1 among the power-off signals $SWD_1$ to $SWD_n$ generated by the power-off control block 505 arranged in the semiconductor device is changed from the high level to the low level. In this situation, the power-off signals $SWD_1$ to $SWD_n$ of the repeating units 103 that do not conduct the power-off are held in the low level. When the PMOS transistor is changed from the off state to the on state, the potential of the internal power wire VDD in the powered-off functional block 1 gradually increase. The internal power wire VDD finally increases up to a potential substantially equal to the potential of the connected external power wire VDDC, and becomes the normal operation state.

In this embodiment, the storage capacity required by the SRAM macro 506 changes with time, and for example, a maximum storage capacity is required in a given time. However, when the SRAM macro 506 is used in an application where the maximum storage capacity is not required in the other time, the unrequired functional block 103 is powered off in the time where the large capacity is not required so that the power consumption of the SRAM macro 506 can be efficiently suppressed.

Also, in the semiconductor device that realizes, multiple applications, even if the storage capacity required for each of the applications is different, the SRAM macro 506 having the required maximum capacity is mounted, and in the application where the large capacity is not required, the unrequired functional block 103 is powered off so that the power consumption of the SRAM macro 506 can be suppressed.

This embodiment shows an example in which the power-off operation is conducted for each of the functional blocks 103. However, the power-off operation may be conducted between the memory array 101 and the other circuits, independently, as described in the second embodiment, or the power supplies each having a different potential may be connected to the memory array 101 and the other circuits as described in the third embodiment.

What is claimed is:
1. A semiconductor device having a plurality of layout units, each of the layout units comprising:
 a memory array having a plurality of memory cells in an SRAM;

a first peripheral circuit that writes data into the memory array and reads the data from the memory array; and
a switch group that disconnects the memory array and the first peripheral circuit, and power wires,
wherein the memory cells are connected to common bit lines,
wherein a direction along which the layout units are arranged is a direction along which the bit lines are wired, and
wherein the switch groups are arranged at both ends of the bit lines in the layout unit in a wiring direction.

2. A semiconductor device comprising:
a plurality of layout units, each of the layout units including:
  a memory array having a plurality of memory cells in an SRAM;
  a first peripheral circuit that writes data into the memory array and reads the data from the memory array; and
  a switch group that disconnects the memory array and the first peripheral circuit, and power wires;
  the first peripheral circuit including a sense amplifier; and
a second peripheral circuit including a selector that is connected to the sense amplifiers included in the layout units, and selects an output of one of the sense amplifiers included in the layout units.

3. A semiconductor device having a plurality of layout units, each of the layout units comprising:
a memory array having a plurality of memory cells in an SRAM;
a first peripheral circuit that writes data into the memory array and reads the data from the memory array;
a first switch group that disconnects the memory array and power wires; and
a second switch group that disconnects the first peripheral circuit and the power wires,
wherein the memory cells are connected to common bit lines,
wherein a direction along which the layout units are arranged is a direction along which the bit lines are wired, and
wherein the switch groups are arranged at both ends of the bit lines in the layout unit in a wiring direction.

4. A semiconductor device comprising:
a plurality of layout units, each of the layout units comprising:
  a memory array having a plurality of memory cells in an SRAM;
  a first peripheral circuit that writes data into the memory array and reads the data from the memory array;
  a first switch group that disconnects the memory array and power wires; and
  a second switch group that disconnects the first peripheral circuit and the power wires, the first peripheral circuit including a sense amplifier; and
a second peripheral circuit including a selector that is connected to the sense amplifiers included in the layout units, and selects an output of one of the sense amplifiers included in the layout units.

5. A semiconductor device having a plurality of layout units, each of the layout units comprising:
a memory array having a plurality of memory cells in an SRAM;
a first peripheral circuit that writes data into the memory array and reads the data from the memory array;
a first switch group that disconnects the memory array and first power wires; and
a second switch group that disconnects the first peripheral circuit and second power wires,
wherein the memory cells are connected to common bit lines,
wherein a direction along which the layout units are arranged is a direction along which the bit lines are wired, and
wherein the switch groups are arranged at both ends of the bit lines in the layout unit in a wiring direction.

6. A semiconductor device comprising:
a plurality of layout units, each of the layout units including:
  a memory array having a plurality of memory cells in an SRAM;
  a first peripheral circuit that writes data into the memory array and reads the data from the memory array;
  a first switch group that disconnects the memory array and first power wires; and
  a second switch group that disconnects the first peripheral circuit and second power wires, the peripheral circuit including a sense amplifier; and
a second peripheral circuit including a selector that is connected to the sense amplifiers included in the layout units, and selects an output of one of the sense amplifiers included in the layout units.

* * * * *